United States Patent
Naganawa

(10) Patent No.: US 6,219,280 B1
(45) Date of Patent: Apr. 17, 2001

(54) NONVOLATILE SEMICONDUCTOR MEMORY DEVICE AND ERASE VERIFY METHOD THEREFOR

(75) Inventor: Koji Naganawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/448,886

(22) Filed: Nov. 29, 1999

(30) Foreign Application Priority Data

Dec. 2, 1998 (JP) .................................................. 10-342850

(51) Int. Cl.$^7$ ................................................... G11C 11/34
(52) U.S. Cl. ................................... 365/185.22; 365/185.11
(58) Field of Search ........................... 365/185.11, 185.22

(56) References Cited

U.S. PATENT DOCUMENTS 6,026,020 * 2/2000 Matsubara et al. ............. 365/185.11

FOREIGN PATENT DOCUMENTS

| | | |
|---|---|---|
| 23-08500 | 12/1990 | (JP) . |
| 4-82094 | 3/1992 | (JP) . |
| 61-31884 | 5/1994 | (JP) . |
| 82-49895 | 9/1996 | (JP) . |
| 93-06197 | 11/1997 | (JP) . |

* cited by examiner

Primary Examiner—David Nelms
Assistant Examiner—M. Tran
(74) Attorney, Agent, or Firm—Young & Thompson

(57) ABSTRACT

A nonvolatile semiconductor memory device includes nonvolatile memory cells, redundant memory cells, a circuit for performing a write and erase in and from the nonvolatile memory cells, an erase verify circuit, a count circuit, a comparison circuit, and a control circuit. The redundant memory cells are switchable from the nonvolatile memory cells. The erase verify circuit sequentially verifies erase of the nonvolatile memory cells one by one. The count circuit counts memory cells not erased to a predetermined state. The comparison circuit compares the count value of the count circuit with a set value set based on the number of redundant memory cells. The control circuit controls the respective functions of the erase verify circuit, count circuit, and comparison circuit on the basis of the comparison result of the comparison circuit. The control circuit controls the respective functions of the erase verify circuit, count circuit, and comparison circuit so as to execute verify for memory cells to be verified next until the count value exceeds the set value. An erase verify method is also disclosed.

19 Claims, 10 Drawing Sheets

NONVOLATILE SEMICONDUCTOR MEMORY DEVICE AND ERASE VERIFY METHOD THEREFOR

BACKGROUND OF THE INVENTION

1. Field of the Invention

The present invention relates to a nonvolatile semiconductor memory device and, more particularly, to a nonvolatile semiconductor memory device having an erase verify circuit for a memory cell, and an erase verify method using the erase verify circuit.

2. Description of the Prior Art

At present, various electronic devices use erasable nonvolatile semiconductor memory devices (EEPROMs), and the EEPROMs are increasing in capacity and integration degree. However, it is difficult to manufacture all memory cells constituting such EEPROM perfectly without any defects, and the defects greatly reduce the yield. To prevent this, manufacturers provide recent large-scale semiconductor memory devices with spare memory cells (to be referred to as redundant memory cells), and set the devices such that a defective memory cell is switched to a redundant memory cell in the wafer inspection step, thereby obtaining high yield. In the wafer inspection step, an EEPROM is inspected by checking whether the circuit current or leakage current satisfies the prescribed standard or reads/writes are normally done, similar to semiconductor memory devices such as a DRAM and SRAM. The EEPROM stores data in accordance with the amount of electrons injected into the floating gate. Unlike the DRAM and SRAM, the EEPROM must be tested for additional inspection items such as whether electrons are normally injected into the floating gate or normally extracted. If a defective memory cell is detected as a result of the inspection, the address of the defective memory cell is stored in a fuse, EEPROM cell, or the like, and the defective memory cell is replaced with a redundant memory cell upon an access to this address.

Of EEPROMs, a flash type nonvolatile semiconductor memory device (to be referred to as a flash memory) has a function of erasing data of all memory cells at once or erasing data of memory cells grouped into a plurality of blocks in units of a predetermined number of blocks. In general, an erase operation is done by applying a high voltage between the gate and semiconductor substrate and flowing an FN (Fowler-Nordheim) tunnel current through a gate oxide film interposed between them. The FN tunnel current varies depending on the film thickness or quality of the gate oxide film or the voltage applied. For example, a large tunnel current flows through a memory cell having a thin gate oxide film to degrade its film quality. Low film quality of the gate oxide film degrades the charge holding characteristic of the floating gate, and the memory contents change over time. If electrons are excessively extracted from the gate, the memory cell is over erased and a current flows even if the cell is not selected. To solve these problems, the flash memory executes memory cell erase operation not all at once but divisionally several times, and gradually erases data while confirming the erase condition. This confirmation operation is called erase verify. The boundary between erase and over erase is called a repair level, the operation of confirming whether a memory cell is over erased is called repair check. An over erased memory cell undergoes write-back processing so as to inject electrons to a predetermined electron injection amount. Verify operation in erase verify and write-back processing is performed by confirming whether the threshold level of a memory cell falls within a predetermined level range. More specifically, a predetermined voltage is applied to the gate of a memory cell, and whether a predetermined current flows is confirmed.

The flash memory must undergo the above-described stepwise erase and erase verify operations even after the memory is assembled into an electronic device. For this purpose, the flash memory itself incorporates a circuit for performing erase verify and repair check, and automatically executes erase operation, erase verify, and repair check (to be referred to as automatic erase processing) in accordance with an erase command or the like supplied from a microprocessor or the like. In an erase of the flash memory, it is checked by erase verify whether all memory cells subjected to an erase reach a predetermined threshold level or less. If even one memory cell does not satisfy this condition, erase processing and erase verify processing are repeated again. When all memory cells reach a level equal to the predetermined threshold level or less, the flash memory informs the microprocessor or the like of the completion of the erase. Also for write operation, write verify may be performed according to the above method, but can be omitted by excessively injecting electrons into a memory cell for storing binary information. The write, erase, and their verify processes are the same even after the flash memory is assembled in an electronic device or in the wafer inspection step.

FIG. 1 is a flow chart showing automatic erase verify processing S400 in a conventional flash memory. First, in a step which is not shown, data is written in all memory cells in order to make the amounts of electrons injected in all the memory cells uniform. Then, a predetermined voltage is applied to the control gates and semiconductor substrates (channels) of all the memory cells to erase data (S401). In this erase processing, as is well known, electrons which had come to be present in the floating gate of a memory cell upon the write processing are extracted to the semiconductor substrate side by an FN current by applying the voltage, thereby decreasing and the threshold level of the memory cell. After that, the start address of a memory cell subjected to an erase is set for the erased memory cell (S402), the threshold level of the memory cell at this address is detected, and whether an erase is properly done is verified (S403). If "Pass" in step S403, whether the address is the last address of the target erase area is checked (S404). If NO in step S404, the address is incremented (S405), and the same verify is executed for all memory cells. Verify is done up to the last address (S406) to complete the erase verify. If "Fail" in step S403, the flow returns to the erase step of step S401 again to repeat the same erase verify processing.

More specifically, memory cells vary in characteristic and are set for the above-described reason such that their data cannot be completely erased by one erase operation. Thus, an unerased memory cell (fail cell) or cells is or are detected. Erase processing is therefore performed again for all memory cells. By this erase processing, an erase voltage is applied again to each memory cell, electrons in the floating gate of the memory cell are further extracted, and the threshold level of the memory cell further drops. As a result, a memory cell which has not reached a predetermined threshold level in a previous erase reaches the predetermined threshold level by the current erase, and it ceases to be a fail cell. When all memory cells reach the predetermined threshold level or less by repeating this processing, verify ends. Note that repair check may be done in step S403, and a memory cell from which electrons are excessively extracted may undergo write processing to return the memory cell to the threshold level.

In this erase verify method, however, when memory cells include some memory cells (to be referred to as peculiar memory cells, exhibiting high threshold levels, erase verify is repeated in the above fashion until the threshold levels of the peculiar memory cells drop to a predetermined level. This prolongs the erase verify processing time. In this case, the peculiar memory cells include a defective memory cell and a cell which requires a long time for an erase because electrons are difficult to extract from it. By repeating erase verify in this way, electrons in the floating gate of a normal memory cell are excessively extracted. The threshold level of the memory cell lowers the repair level to over erase the memory cell, or becomes negative to again over erase the memory cell. FIG. 2 is a graph showing the threshold level distribution in all memory cells subjected to an erase. As described above, when erase verify is repeated to decrease the threshold levels of some peculiar memory cells falling outside the main distribution to a predetermined threshold level, this processing takes a long time. At this same time, since the threshold levels of all memory cells drop, the threshold levels of many memory cells belonging to the main distribution excessively drop, and most of the memory cells are over erased. To prevent this, write-back processing for recovering the threshold level of an over erased memory cell to an original level is performed as post-processing of erase verify. However, many memory cells must be written back in write-back processing, prolonging the write-back processing time. Thus, in conventional erase verify, the processing time for repeating erase verify a plurality of number of times and the processing time for performing write-back processing are long, prolonging the total processing time of automatic erase verify. This prolongs the processing time of the wafer inspection step, reduces the productivity of the nonvolatile semiconductor memory device, and raises the manufacturing cost. Furthermore, since the numbers of erase and write-back processes increase, the gate oxide film deteriorates, and the electron holding period of the floating gate is shortened to cause loss of memory data, resulting in low reliability of the flash memory.

SUMMARY OF THE INVENTION

The present invention has been made to overcome the conventional drawbacks, and has as its object to provide a nonvolatile semiconductor memory device capable of erase verify within a short time, and an erase verify method therefor.

According to the first main aspect of the present invention, there is provided a nonvolatile semiconductor memory device comprising nonvolatile memory cells, redundant memory cells switchable from the memory cells, means for performing a write and erase in and from the nonvolatile memory cells, erase verify means for sequentially verifying erase of the nonvolatile memory cells one by one, count means for counting memory cells that are not erased to a predetermined state, comparison means for comparing a count value of the count means with a set value set based on the number of redundant memory cells, and control means for controlling the erase verify means, the count means, and the comparison means on the basis of a comparison result of the comparison means, the control means controlling the respective functions of the erase verify means, the count means, and the comparison means so as to execute verify for memory cells to be verified next until the count value exceeds the set value. The semiconductor memory device in the first main aspect preferably further comprises setting means for setting the set value set by the comparison means to the number of switchable redundant memory cells. When the count value exceeds the set value, the control means can control to erase verify again from a memory cell verified first. The control means has a function of switching a memory cell not erased to the predetermined state to a redundant memory cell when erase verify processing ends while the count value is not higher than the set value.

According to the second main aspect of the present invention, there is provided an erase verify method for a nonvolatile semiconductor device which uses nonvolatile memory cells and redundant memory cells switchable from the memory cells, and includes erase verify processing of performing a write and erase in and from the nonvolatile memory cells and determining whether the memory cells are at a predetermined level, comprising the steps of sequentially performing erase verify processing for the memory cells one by one, counting the number of memory cells which do not reach the predetermined level, and continuing erase verify processing for subsequent memory cells until a count value exceeds a set value set based on the number of redundant memory cells. The erase verify method in the second main aspect further comprises restarting erase verify processing for all memory cells when the count value exceeds the set value. The number of switchable redundant memory cells is set as the set value.

In addition, an erase verify method according to the present invention which uses a plurality of nonvolatile memory cell columns connected to a plurality of digit lines, and M redundant memory cell columns which are connected to redundant digit lines and are switchable from the nonvolatile memory cells may comprise the steps of detecting erase levels of the memory cell columns, counting the number of defective digit lines each having at least one defective memory cell exceeding the erase level, and continuing erase verify processing of detecting the erase level until a count value exceeds M. In this case, the method comprises setting means for setting a value M obtained by subtracting the number m of switched redundant digit lines from the number Mo of redundant digit lines, and erase verify processing of detecting the erase level continues until the count value exceeds M.

As is apparent from the above aspects, verify for subsequent memory cells continues without repeating an erase for the memory cells until the number of fail cells as memory cells which do not reach a predetermined erase state exceeds a set value. The repeat number of erase verify processes for all memory cells is decreased, and automatic erase verify processing can be completed within a short time. The number of memory cells over erased by erase verify processing is decreased, and write-back processing executed after automatic erase verify processing can be completed within a short time. Hence, the verify step including automatic erase verify processing for EEPROM memory cells can be completed within a short time. Further, the processing time of the wafer inspection step can be shortened to improve the productivity of the nonvolatile semiconductor memory device and reduce the manufacturing cost. Since the numbers of erase and write-back processes decrease, deterioration of the gate oxide film can be prevented not to degrade the electron holding characteristic of the floating gate and erase any memory data. As a result, the reliability of the flash memory can be maintained.

The above and many other objects, features and advantages of the present invention will become manifest to those skilled in the art upon making reference to the following detailed description and accompanying drawings in which preferred embodiments incorporating the principle of the present invention are shown by way of illustrative examples.

DETAILED DESCRIPTION OF PREFERRED EMBODIMENTS

Several preferred embodiments of the present invention will be described below with reference to the accompanying drawings.

Figure 1:
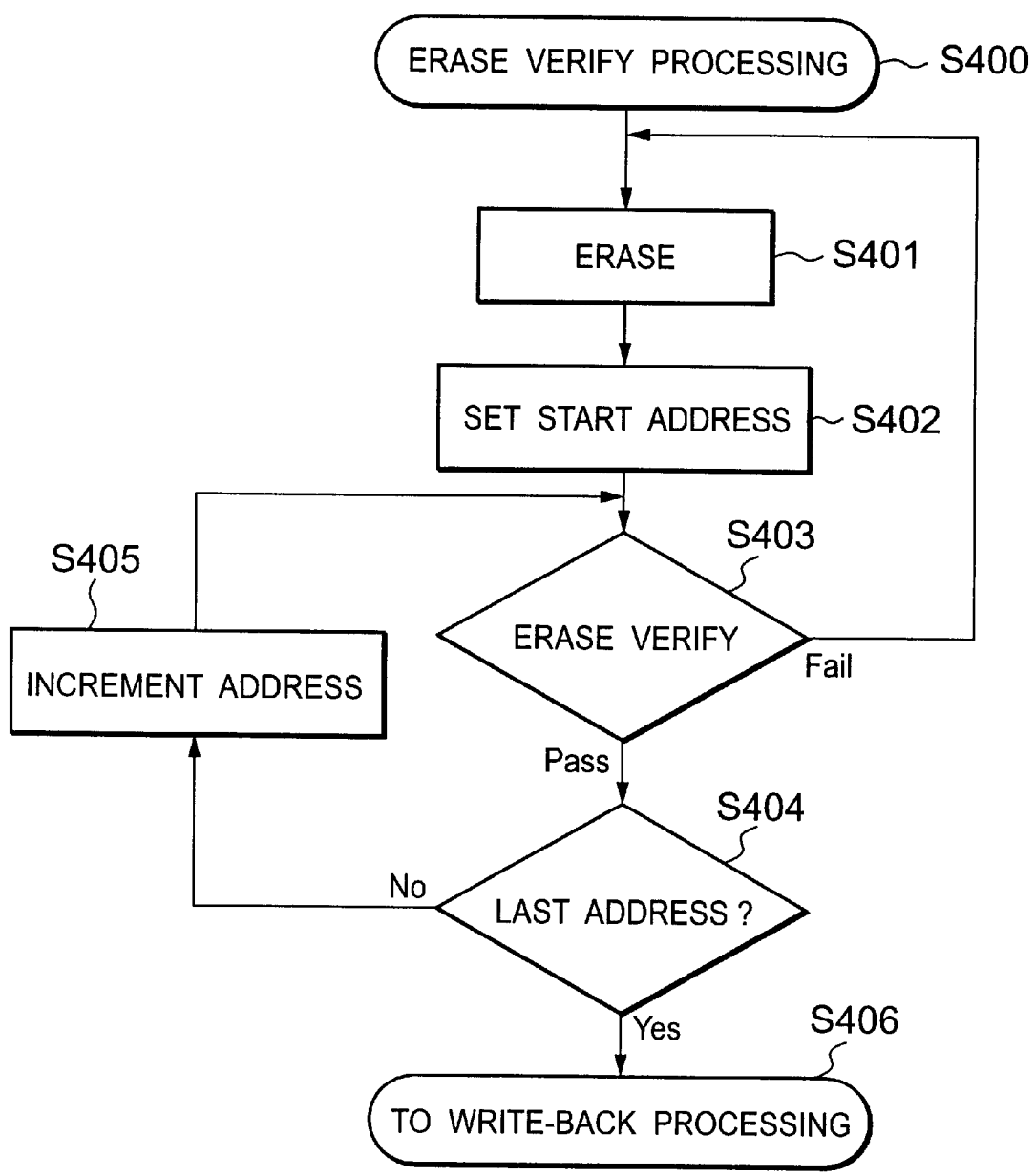
FIG. 1 is a flow chart showing the operation sequence of erase verify processing in a conventional flash memory.
Figure 2:
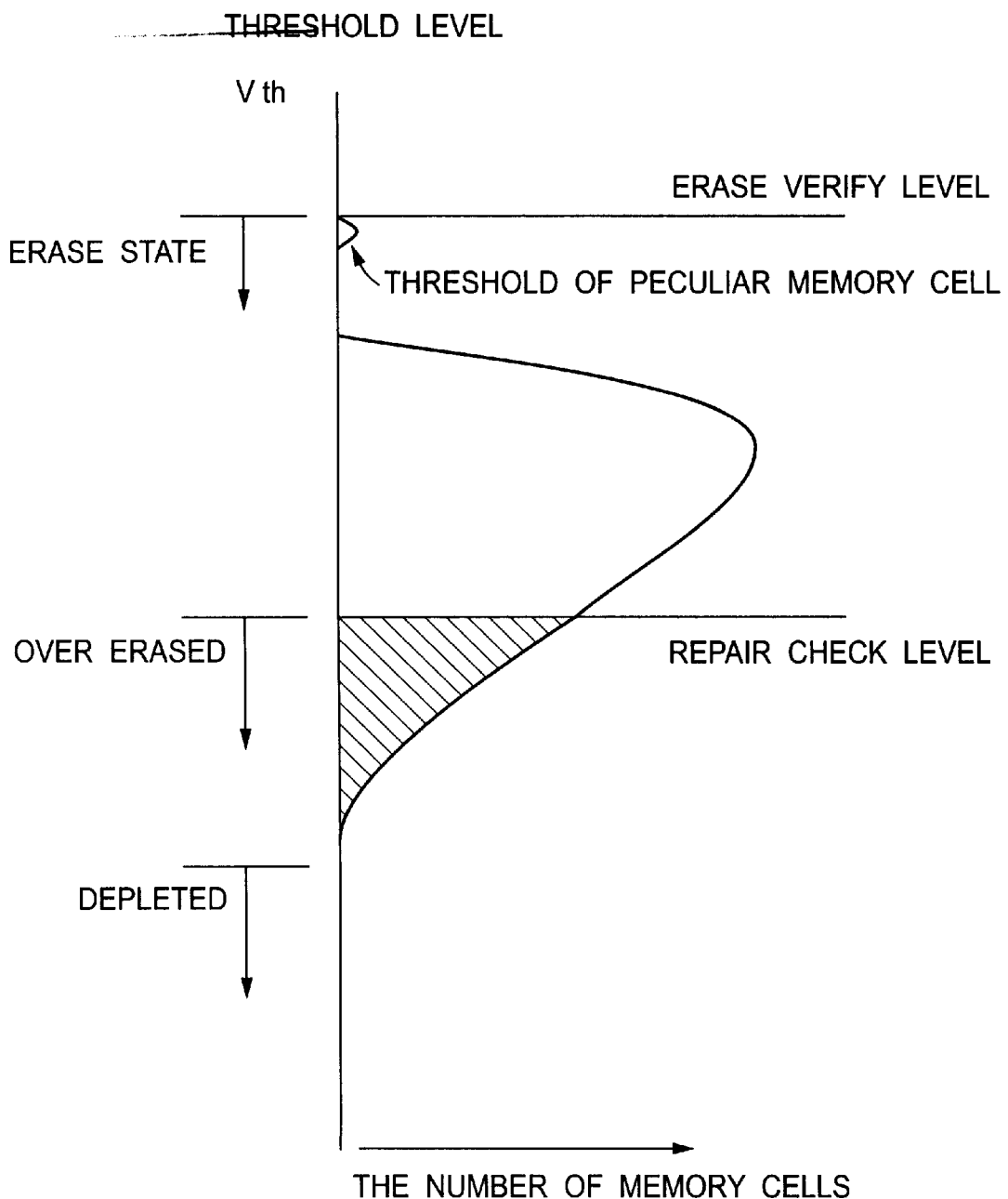
FIG. 2 is a graph showing the threshold level distribution of a memory cell in conventional erase verify processing.
Figure 3:
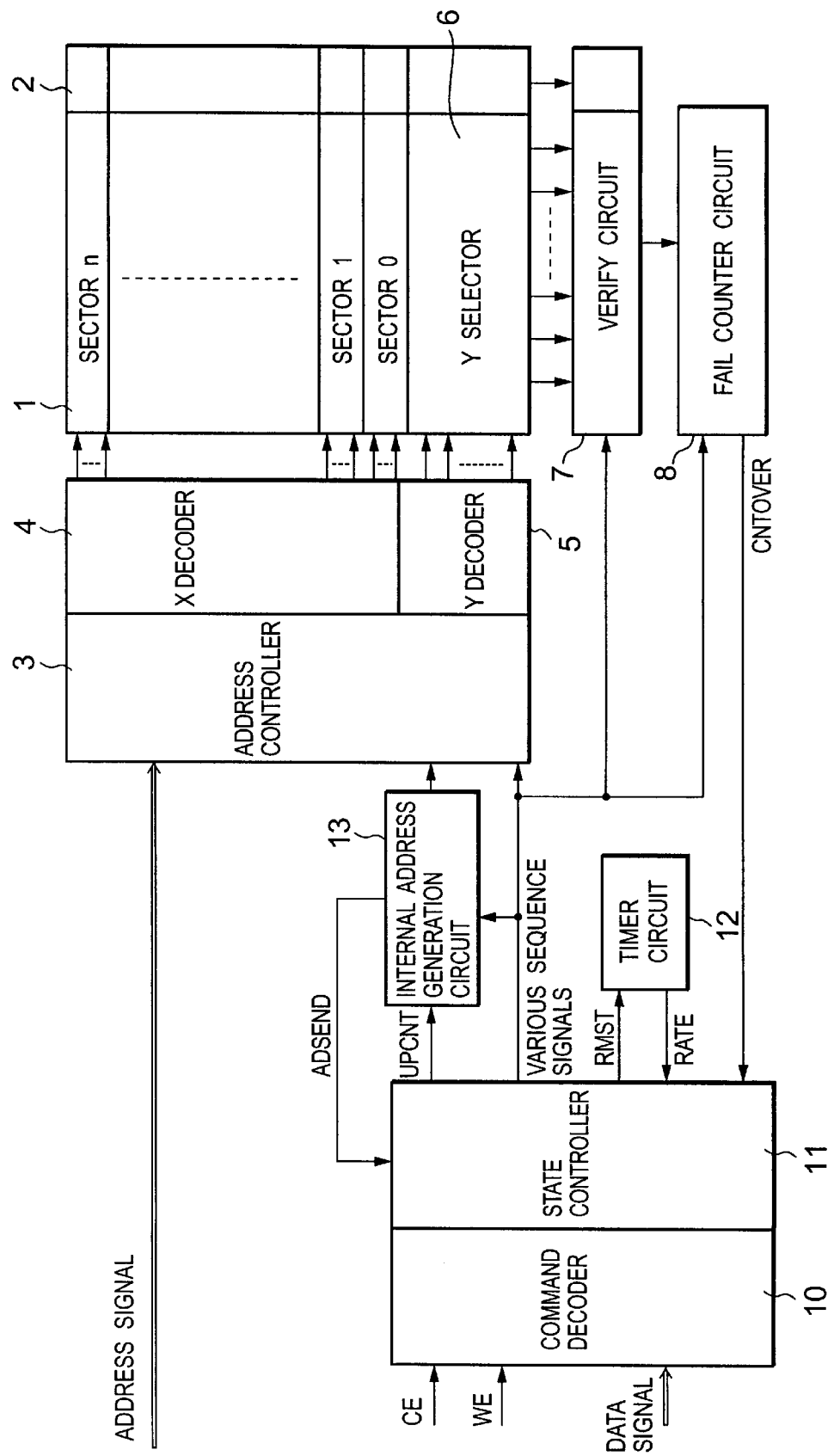
FIG. 3 is a block diagram showing the arrangement of a nonvolatile semiconductor memory device according to the first embodiment of the present invention.

FIG. 3 is a block diagram showing an EEPROM according to the present invention. Memory cells 1 are divided into a plurality of sectors 0 to n, each of which comprises redundant memory cells 2. Fail cells detected among the memory cells 1 in sectors 0 to n can be switched to the redundant cells 2 in units of sectors. An address controller 3 latches an address signal supplied from a microprocessor or wafer inspection device (to be referred to as a tester). Based on this address signal, an X decoder 4 selects one of sectors 0 to n, and selects the X line (word line) in the selected sector. Based on the address signal, a Y decoder 5 controls a Y selector 6 to select a Y line (digit line) crossing sectors 0 to n of the memory cells 1. A verify circuit 7 detects the threshold level of each memory cell output from the Y line selected by the Y selector 6, and verifies whether the selected memory cell satisfies a predetermined condition. In normal operation, the verify circuit 7 operates as a sense amplifier circuit by changing a reference voltage or the like. An output from the sense amplifier circuit outputs memory data outside via an output buffer (not shown). A fail counter circuit 8 counts the number of fail cells detected by erase verify executed in the verify circuit 7, and accumulates the count value. A set value M is set in the fail counter circuit 8. When the count value counted by the fail counter circuit exceeds the set value M, the fail counter circuit 8 outputs a count-over signal CNTOVER to a state controller 11 (to be described below).

A command decoder 10 receives a chip enable signal CE, write enable signal WE, and data signal from a tester and the like, and decoders these signals. The state controller 11 recognizes (decodes) a command to output a timer circuit activation signal TMST to a timer circuit 12, thereby activating the timer circuit 12. The timer circuit 12 generates an internal operation timing signal RATE. At the end of erase verify for a preceding address, an internal address generation circuit 13 increments the internal address based on an instruction of an up-count signal UPCNT output from the state controller 11, and outputs the obtained internal address to the address controller 3. The state controller 11 outputs various sequence signals for executing a flow (to be described later), and controls the internal address generation circuit 13, verify circuit 7, and fail counter circuit 8. An externally supplied address signal selects a sector which is subjected to an erase, and the flash memory executes erase processing. The internal address generation circuit 13 generates a lower address in the sector, and supplies the internal address to the address controller 3. The internal address generation circuit 13 determines whether the incremented internal address signal coincides with the last address of the sector, and if the internal address signal reaches the last address, supplies an address end signal ADSEND to the state controller 11, thereby completing the processing. If the address end signal ADSEND is not activated, the state controller 11 determines that the internal address signal has not reached the last address, and outputs an up-count signal UPCNT to the internal address generation circuit 13. Thereafter, the flash memory notifies the tester or the like of the end of erase verify, or sets an erase verify processing end flag to make the tester or the like recognize the end of erase verify. Note that the end address may be supplied from the tester or the like, or if the sector size is determined in advance, may be set in the internal address generation circuit 13 in advance. Alternatively, the last address may be determined by comparing last address information of the state controller 11 with an output address from the internal address generation circuit 13.

Figure 4:
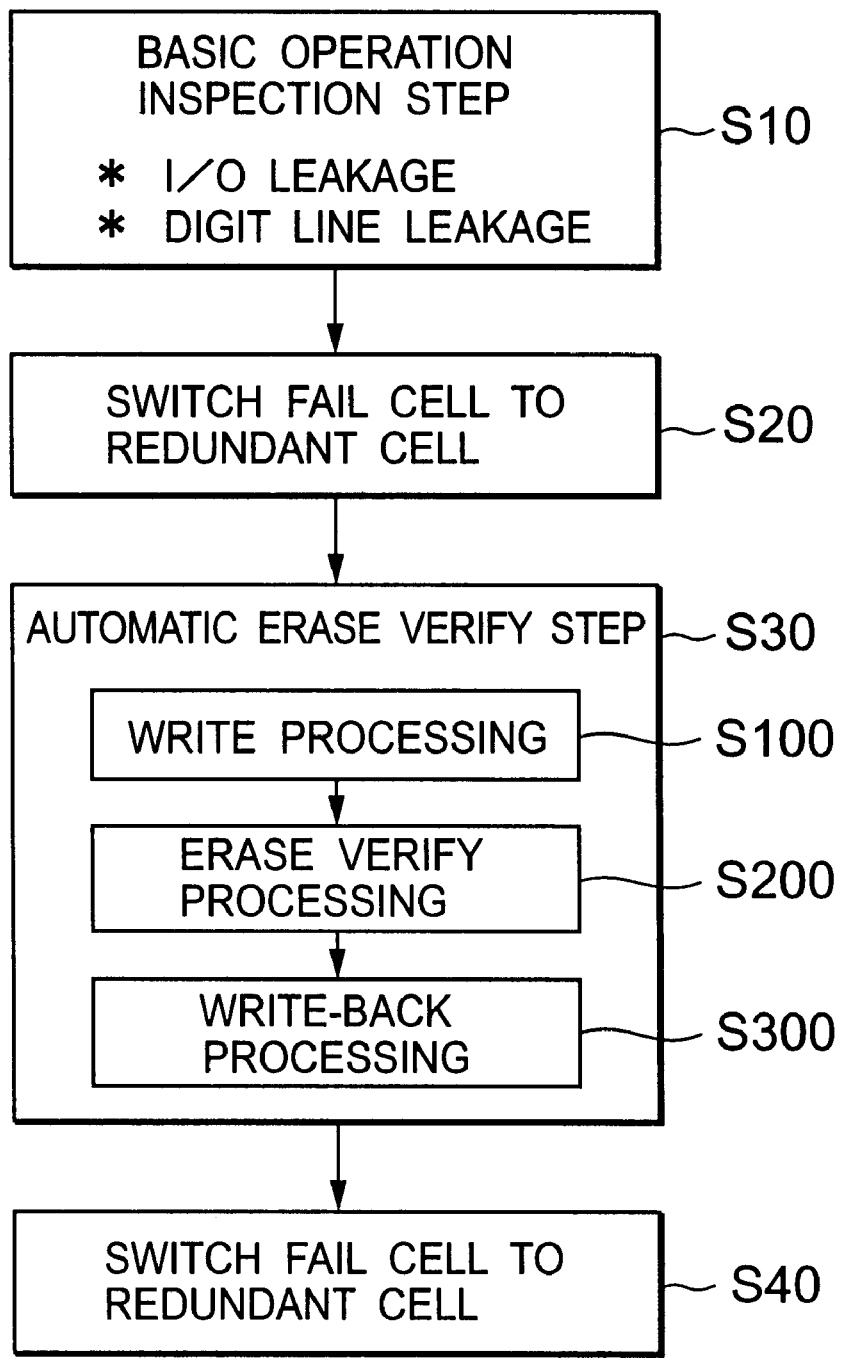
FIG. 4 is a flow chart showing the verify step of the nonvolatile semiconductor memory device according to the present invention.

FIG. 4 is a flow chart schematically showing the flash memory verify step in the wafer inspection step including the erase verify step for the flash memory having the circuit arrangement of FIG. 3. In basic operation inspection step S10 serving as pre-processing, an inspection probe is brought into contact with a flash memory chip formed on a wafer, a predetermined voltage is applied to each pad of the chip to measure the flowing leakage current, and whether the leakage current falls within a predetermined range is inspected. This is called I/O leakage inspection. In addition, a predetermined power supply voltage is applied between a power supply pad and ground pad to inspect the basic operation of the flash memory except for erase operation, e.g., whether there is a digit line failing in a read/write of predetermined memory data owing to a large leakage current of a peculiar memory cell. If a defective such as a fail cell is detected in basic operation inspection step S10 and can be replaced with a corresponding redundant cell 2, the defective cell is switched to a redundant cell 2. If the cell remains defective even after it is replaced with the redundant cell, the chip is discarded as a defective chip (S20)

The flow executes automatic erase verify step S30. In a normal memory wafer inspection step, the tester supplies an address signal to a memory chip, and determines a read signal. To the contrary, in automatic erase verify step S30, the memory chip automatically executes erase verify processing only by supplying an erase. command and an address signal of a target erase memory sector to the memory chip, and notifies the tester of the end of processing. First, write processing (S100) is executed for the memory cells 1. In this write processing (S100), a write is executed for all memory cells, and whether a predetermined write is done is verified. The purpose of write processing S100 is as follows. More specifically, a memory cell storing "1" and a memory cell storing "0" are different in the amount of electrons injected into the floating cell. If an erase is executed in this state, these cells are erased to different degrees, and are readily over erased. To prevent this, write processing S100 is executed before executing erase processing.

Subsequently, erase verify processing (S200) is executed for memory cells, which is a feature of the present invention. In the erase verify processing (S200), data of the written memory cells are erased, and whether the erased memory cells decrease to a predetermined threshold level is verified. If fail cells in which the threshold levels do not reach the predetermined threshold level are detected, the number of fail cells is counted, and erase verify processing continues until the count value reaches a predetermined value. If the number of fail cells exceeds the set value, erase verify is repeated again from the first. After the erase verify processing (S200) ends, write-back processing (S300) is executed for any over erased memory cell. If this memory cell can be replaced with the corresponding redundant cell 2, the switching step to a redundant cell 2 is executed. If the memory cell remains defective even after it is replaced with the redundant cell, the chip is discarded as a defective chip (S40).

Figure 5:
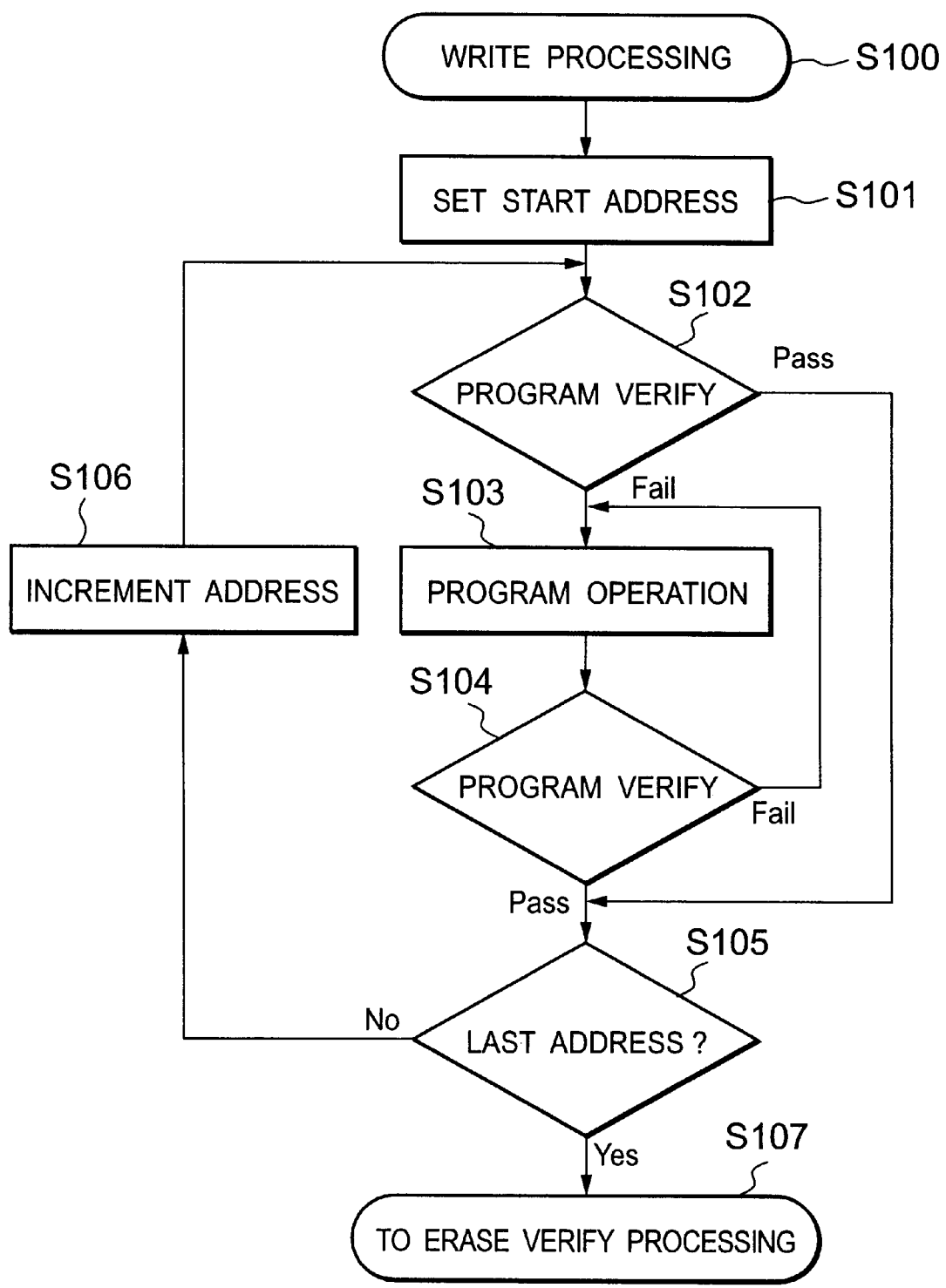
FIG. 5 is a flow chart showing write processing in the present invention.

Automatic erase verify step S30 will be explained. FIG. 5 is a flow chart showing write processing S100. The tester supplies an address signal to the address controller 3, and sets the start address of a memory sector which is subjected to an erase in the internal address generation circuit 13 (S101). The X decoder 4 and Y decoder 5 select a memory cell, and the verify circuit 7 detects a threshold level output from the Y line of the selected memory cell to determine whether the memory cell is written (S102). If "Fail" in step S102, a predetermined voltage is applied between the floating gate and drain of the memory cell to write or program, that is, to inject electrons into the floating gate (S103). Whether the program operation is normally done is verified (S104). This verify is performed by applying a predetermined voltage to the gate (X line) of the memory cell and comparing a drain current flowing through the memory cell with a reference current by the verify circuit 7, or by applying a normal voltage to the gate (X line) of the memory cell and comparing a drain current flowing through the memory cell with a predetermined reference current by the verify circuit 7. If the verify circuit 7 outputs "1", "Pass" is determined; if the circuit 7 outputs "0", "Fail" is determined. This determination result is supplied to the state controller 11. If the program operation is unproperly "Fail", the flow repeats step S103 again. If the program operation is "Pass", the state controller 11 determines whether the address is a last one (Sl05). If NO in step S105, the state controller 11 outputs an up-count signal UPCNT to the internal address generation circuit 13, the internal address generation circuit 13 increments the address (S106), and the same program operation is executed for a memory cell at the next address. Note that if a memory cell is determined in step S102 to have already been programmed, the flow shifts to step S105. The above operation is repeated for all memory cells, and when program operation is complete for all the memory cells, write processing ends (S107).

Figure 6:
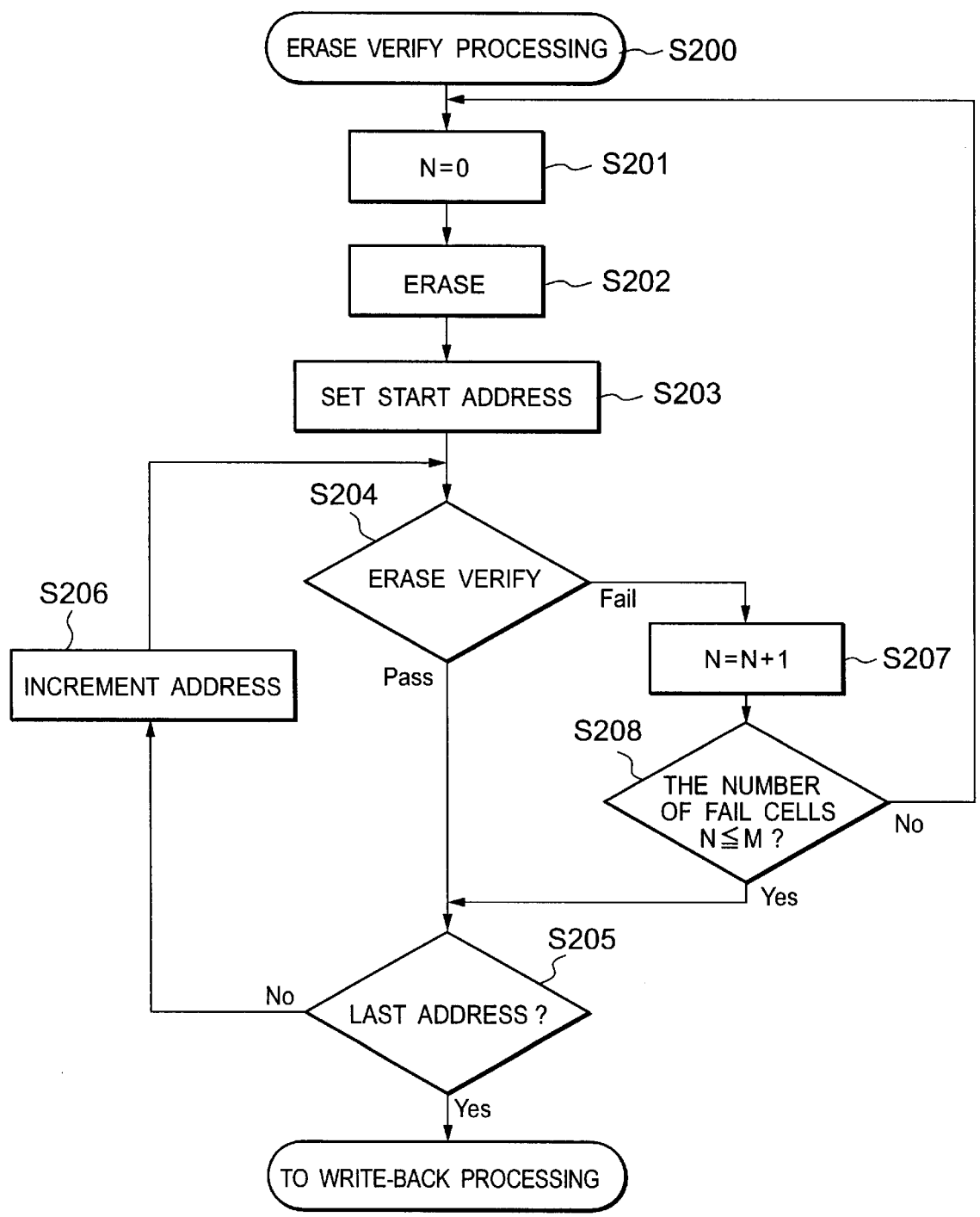
FIG. 6 is a flow chart showing erase verify processing in the present invention.

FIG. 6 is a flow chart showing erase verify processing S200. After write processing S100, the count value of the counter incorporated in the fail counter circuit 8 is set to N=0 (S201), and data of all memory cells 1 which are to be erased are simultaneously erased (S202). The simultaneous erase processing itself is the same as a conventional one, and performed by applying a predetermined voltage between the floating gates and semiconductor substrates of all memory cells to be erased. Then, the tester supplies a start address signal to the address controller 3, and sets the start address in the internal address generation circuit 13 (S203). The X decoder 4 and Y decoder 5 select a memory cell, and a threshold level output from the Y line of the selected memory cell is detected. The verify circuit 7 compares the threshold level of the memory cell with a predetermined verify threshold level to verify whether a proper erase is done (S204). This verify is performed by applying a predetermined voltage to the gate (X line) of the memory cell and comparing a drain current flowing through the memory cell with a reference current by the verify circuit 7, or by applying a normal voltage to the gate (X line) of the memory cell and comparing a drain current flowing through the memory cell with a predetermined reference current by the verify circuit 7. If the verify circuit 7 outputs "0", the threshold level of the memory cell is equal to or lower than the predetermined threshold level, and "Pass" is determined; if the circuit 7 outputs "1", "Fail" is determined. This determination result is supplied to the state controller 11. If the threshold level is equal to or lower than the verify threshold level, the erase operation is proper. The internal address generation circuit 13 checks whether the address is a last one (S205). If NO in step S205, the internal address generation circuit 13 outputs an address end signal ADSEND of "0" (inactive) to the state controller 11. The state controller 11 confirms the address end signal ADSEND of "0", and supplies an up-count signal UPCNT to the internal address generation circuit 13. The internal address generation circuit 13 increments the address (S206). The same erase verify processing from step S204 is executed for a memory cell at the next address. If the threshold level of the memory cell is higher than the verify threshold level, and the erase operation is detected to be improper, the memory cell is determined to be a fail cell, and the count value of the fail counter circuit 8 is set to N=N+1 (S207).

The value N is compared with the predetermined set value M (S208). This value M corresponds to the number of cells switchable to redundant cells 2. If N is equal to or lower than M, the flow shifts to step S205 so as to switch the memory cell to the corresponding redundant cell later. Whether the address is a last one is checked, and if NO in step S205, the memory cell at the next address is verified. This loop is repeated up to the memory cell at the last address while N remains equal to or lower than M, and erase verify ends (S209). To the contrary, if N exceeds M in step S208, the flow returns to step S201 to reset the count value of the fail counter circuit 8 to N=0. Then, erase verify processing from step S202 is repeated again for all memory cells. When erase verify processing ends while N is equal to or lower than M, erase verify ends (S209).

Figure 7:
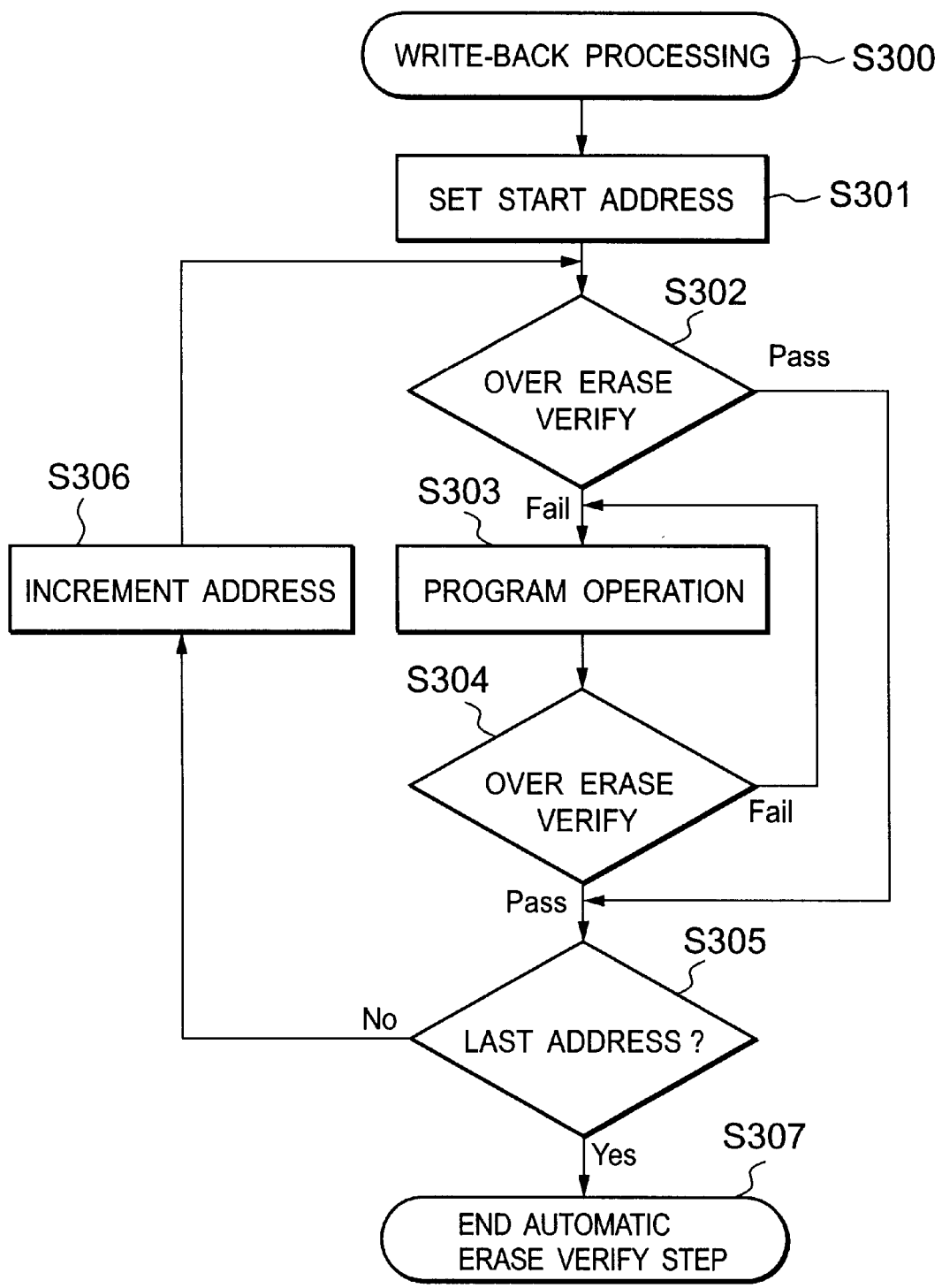
FIG. 7 is a flow chart showing write-back processing in the present invention.

After erase verify processing S200, write-back processing S300 is done for an over erased memory cell determined by erase verify processing S200 to be over erased or depleted. FIG. 7 is a flow chart showing write-back processing S300. The start address of a memory cell is set (S301), and the threshold voltage of a memory cell selected by the X decoder 4 and Y decoder 5 is verified (S302). If the memory cell is over erased, electrons are injected into the floating gate to write back (S303). Whether this write-back operation is properly performed is verified (S304). If "Fail" in step S304, processing in step S303 is repeated again. If "Pass" in step S304, whether the address is a last one is checked (S305). If NO in step S305, the address is incremented (S306), and the same processing is done for a memory cell at the next address. If write-back operation is complete for all memory cells, write-back processing ends (S307). Note that if a memory cell is determined in step S304 not to be over erased, the flow shifts to step S305.

Figure 8:
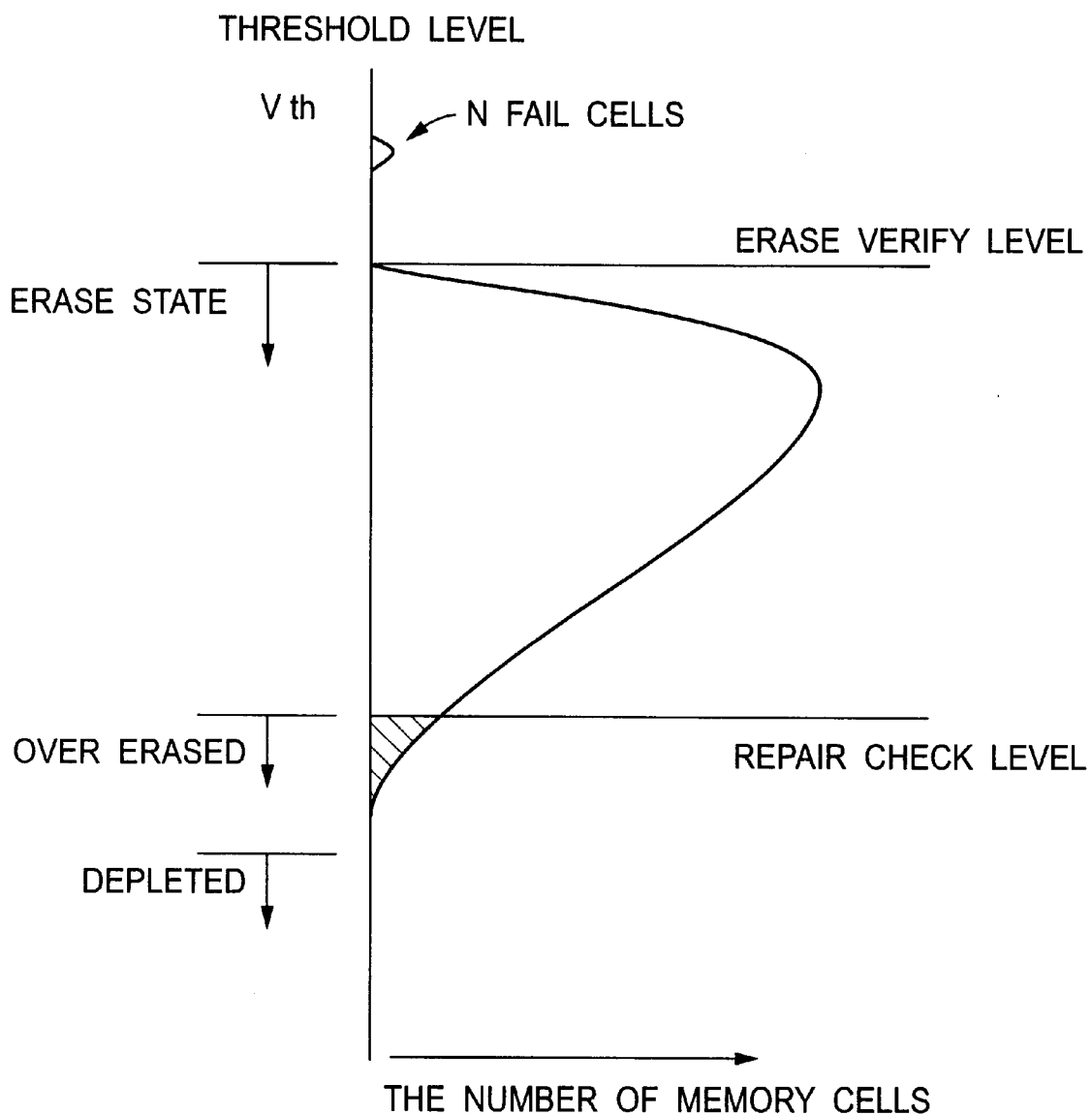
FIG. 8 is a graph showing the threshold level distribution of a memory cell in erase verify according to the present invention.

In the above manner, write processing S100, erase verify processing S200, and write-back processing S300 end. At this time, as is apparent from the threshold level distribution of all memory cells that are to undergo an erase in FIG. 8, N memory cells determined as fail cells have higher threshold levels than those of memory cells falling within the main distribution. Thus, these fail cells are switched to the corresponding redundant cells. The switched redundant cells undergo the same write processing, erase verify processing, and write-back processing. This makes it possible to remedy the fail cells as memory cells having threshold levels near those of memory cells within the main distribution.

According to the first embodiment, verify for subsequent memory cells continues without repeating an erase for memory cells until the number of fail cells exceeds the set value M. For this reason, the repeat number of erase operations for memory cells can be minimized to shorten the erase verify processing time. Since the repeat number of erase operations is minimized, over erasing of memory cells can be suppressed, the number of memory cells depleted at the end of erase processing can be reduced, and the processing time of subsequent write-back processing can be shortened. This can shorten the total processing time of the wafer inspection step, can improve the productivity of the nonvolatile semiconductor memory device, and can reduce the manufacturing cost. Moreover, since the numbers of erase and write-back processes decrease, deterioration of the gate oxide film can be prevented so as not to degrade the electron holding characteristic of the floating gate and erase any memory data. Consequently, the reliability of the flash memory can be maintained.

Figure 9:
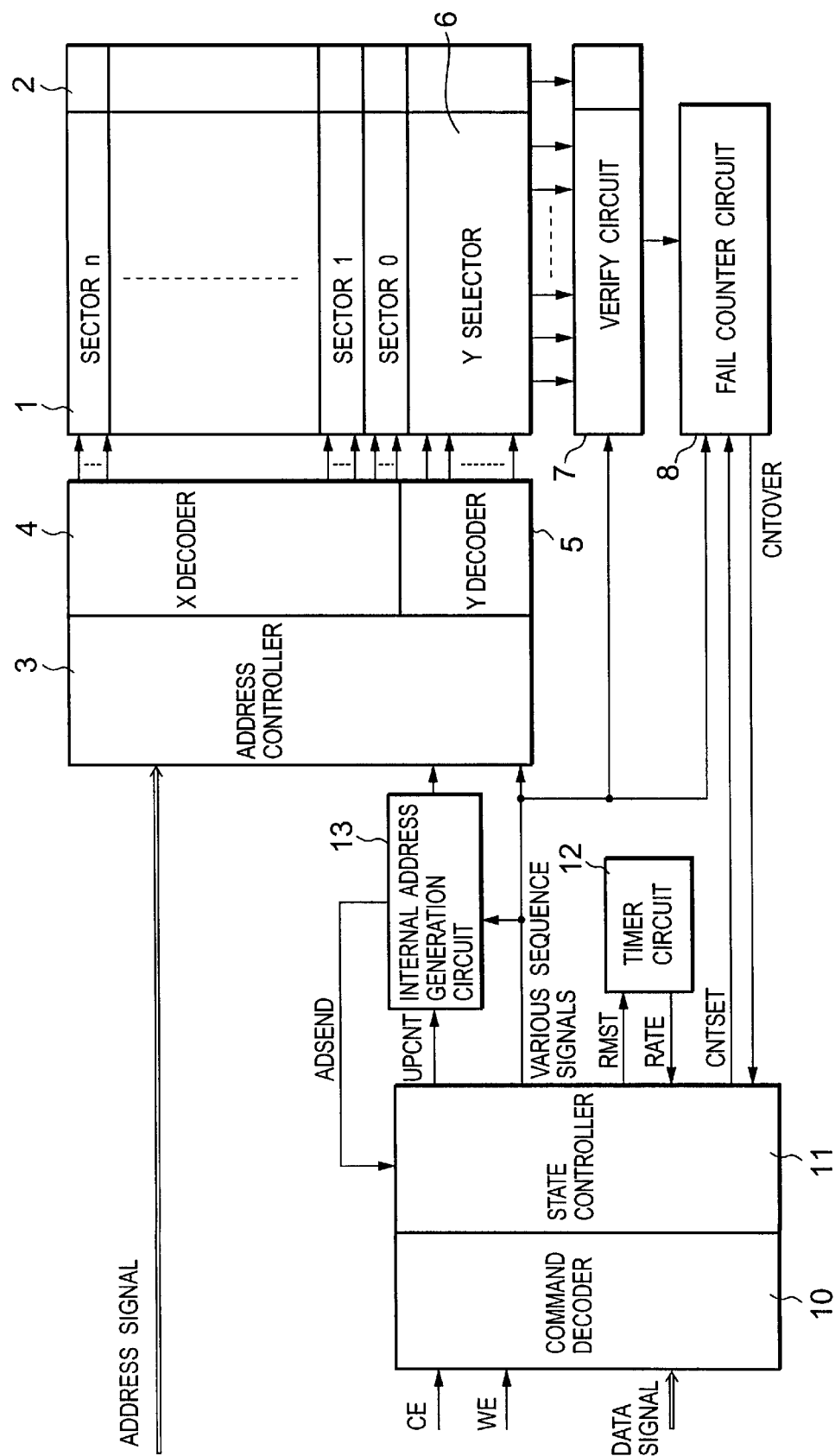
FIG. 9 is a block diagram showing an arrangement according to the second embodiment of the present invention.

FIG. 9 is a block diagram showing a nonvolatile semiconductor memory device according to the second embodiment of the present invention. In FIG. 9, the same reference numerals as in the first embodiment shown in FIG. 3 denote the same parts. In the second embodiment, a state controller 11 outputs to a fail counter circuit 8 a count set signal CNTSET for setting a set value M of the fail counter circuit 8. The count set signal CNTSET is output to change the set value M based on redundant cell switching processing S20 executed after circuit verify step S10.

Figure 10:
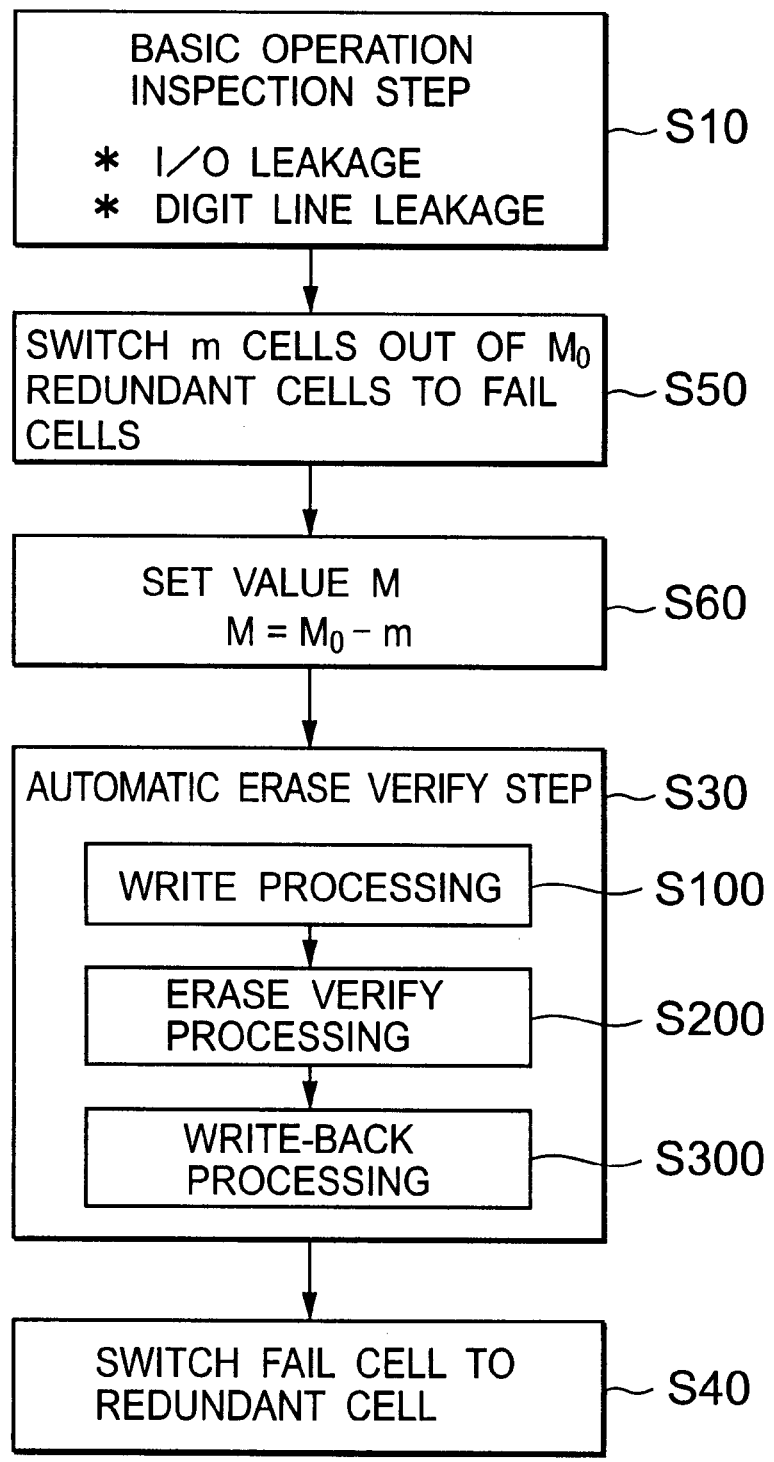
FIG. 10 is a flow chart showing the verify step in the second embodiment.

FIG. 10 is a flow chart for explaining verify in the second embodiment of the present invention. The same reference numerals as in the first embodiment shown in FIG. 4 denote the same steps. In the second embodiment, the tester recognizes the number Mo of redundant cells 2 of memory cells 1 in basic operation inspection step S10, and detects a fail cell in basic operation inspection step S10. When the fail cell is switched to the corresponding redundant cell in redundant cell switching processing S50, the set value M of the fail counter circuit 8 is set to a value obtained by subtracting the number m of switched cells from the number $M_0$ of redundant cells, i.e., the number M of redundant cells switchable from fail cells=$M_0$–m in erase verify step S30. Considering this, the second embodiment inserts before automatic erase verify step S30 the step of setting the set value M ($M_0$–m) in the tester and fail counter circuit 8 (S60). In the subsequent automatic erase verify step S30, the automatic erase verify step based on the number M of remaining switchable redundant cells=$M_0$ –m can be realized. More specifically, the tester detects the number m of defective memory cells in steps S10 and S50, sets their addresses at fuses or the like, and calculates the number M (=$M_0$–m) of remaining redundant cells. The tester supplies the set value M as a data signal to a flash memory, and a command decoder 10 sets the set value M in the fail counter circuit 8 via the state controller 11.

When redundant cell switching processing includes a plurality of steps, the set value M is obtained in processing S60 by subtracting the sum of the numbers m1, m2, ... of switched cells from the number $M_0$ of redundant cells, i.e., M=$M_0$m1–m2 .... The above-described erase verify is also done for redundant cells in advance, and the number mr of defective redundant cells is subtracted from the set value (M=$M_0$mr–m1–m2 ... ). Note that automatic erase verify step S30 itself is the same as in the first embodiment, and a description thereof will be omitted. In the second embodiment, each of sectors 0 to n of the memory cells 1 shown in FIG. 9 comprises $M_0$ redundant cells. This is effective when different numbers of redundant cells are switched in the respective sectors in basic operation inspection step S10, erase verify is executed for the respective sectors, and redundant cells are switched in units of sectors.

In the above description, memory cells are verified one by one. Alternatively, the present invention can be applied to the case of verifying memory cells in units of bytes or a predetermined number of memory cells. In this case, redundant cells can also be switched in units of bytes or a predetermined number of cells, and the set value in the fail counter circuit is set to the unit number of redundant cells to be switched. Further, redundant cells are switched in units of memory cells in the above embodiments, but may be switched in units of digit lines. At this time, even if a plurality of defective memory cells exist on one digit line, the number of digit lines of redundant cells to be switched is one. Also, the present invention can be applied to a memory in which redundant cells are formed in the row direction, and defective word lines are switched to redundant word lines in units of word lines. At this time, the number M of redundant cell columns is set in the fail counter, and the number Q of redundant cell rows is set in another register. Incorporating the verify circuit and fail counter circuit in the flash memory can reduce the processing load on the tester side. Hence, the tester can simultaneously inspect a larger number of memories, and the productivity of the semiconductor memory device can be further improved.

What is claimed is:

1. A nonvolatile semiconductor memory device comprising nonvolatile memory cells, redundant memory cells switchable from said nonvolatile memory cells, means for performing a write and erase in and from said nonvolatile memory cells, erase verify means for sequentially verifying erase of said nonvolatile memory cells one by one, count means for counting said nonvolatile memory cells that are not erased to a predetermined state, comparison means for comparing a count value of said count means with a set value set based on the number of redundant memory cells, and control means for controlling respective functions of said erase verify means, said count means, and said comparison means on the basis of a comparison result of said comparison means, said control means controlling the respective functions of said erase verify means, said count means, and said comparison means so as to execute erase verify for nonvolatile memory cells to be verified next until the count value exceeds the set value.

2. A device according to claim 1, further comprising setting means for setting the set value set by said comparison means to the number of switchable redundant memory cells.

3. A device according to claim 2, wherein when the count value exceeds the set value, said control means controls to erase verify again from a nonvolatile memory cell verified first.

4. A device according to claim 3, wherein said control means has a function of switching a nonvolatile memory cell not erased in the predetermined state to a redundant memory cell when erase verify processing ends while the count value is not higher than the set value.

5. A device according to claim 2, wherein said control means has a function of switching a nonvolatile memory cell not erased in the predetermined state to a redundant memory cell when erase verify processing ends while the count value is not higher than the set value.

6. A device according to claim 1, wherein when the count value exceeds the set value, said control means controls to erase verify again from a nonvolatile memory cell verified first.

7. A device according to claim 6, wherein said control means has a function of switching a nonvolatile memory cell not erased in the predetermined state to a redundant memory cell when erase verify processing ends while the count value is not higher than the set value.

8. A device according to claim 1, wherein said control means has a function of switching a nonvolatile memory cell not erased in the predetermined state to a redundant memory cell when erase verify processing ends while the count value is not higher than the set value.

9. An erase verify method which uses nonvolatile memory cells and redundant memory cells switchable from the nonvolatile memory cells, and includes erase verify processing of performing a write and erase in and from the nonvolatile memory cells and determining whether the nonvolatile memory cells are at a predetermined level, comprising the steps of sequentially performing erase verify processing for the nonvolatile memory cells one by one, counting the number of nonvolatile memory cells which do not reach the predetermined level, and continuing erase verify processing for subsequent nonvolatile memory cells until a count value exceeds a set value set based on the number of redundant memory cells.

10. A method according to claim 9, further comprising restarting erase verify processing for all nonvolatile memory cells when the count value exceeds the set value.

11. A method according to claim 10, wherein the number of switchable redundant memory cells is set as the set value.

12. A method according to claim 11, wherein nonvolatile memory cells which do not reach the predetermined level are switched to the redundan t memory cells.

13. A method according to claim 10, wherein nonvolatile memory cells which do not reach the predetermined level are switched to the redundant memory cells.

14. A method according to claim 9, wherein the number of switchable redundant memory cells is set as the set value.

15. A method according to claim 14, wherein nonvolatile memory cells which do not reach the predetermined level are switched to the redundant memory cells.

16. A method according to claim 9, wherein nonvolatile memory cells which do not reach the predetermined level are switched to the redundant memory cells.

17. An erase verify method which uses a plurality of nonvolatile memory cell columns connected to a plurality of digit lines, and M redundant memory cell columns which are connected to redundant digit lines and are switchable from the nonvolatile memory cells, comprising the steps of detecting erase levels of the nonvolatile memory cell columns, counting the number of defective digit lines each having at least one defective nonvolatile memory cell exceeding the erase level, and continuing erase verify processing of detecting the erase level until a count value exceeds M.

18. A method according to claim 17, wherein the method comprises setting means for setting a value M obtained by subtracting the number m of switched redundant digit lines from the number of Mo redundant digit lines, and erase verify processing of detecting the erase level continues until the count value exceeds M.

19. An erase verify method which uses nonvolatile memory cells and redundant memory cells switchable from the nonvolatile memory cells, and includes erase verify processing of performing a write and erase in and from the nonvolatile memory cells and determining whether the nonvolatile memory cells are at a predetermined level, comprising the steps of sequentially performing erase verify processing for the nonvolatile memory cells one by one, counting the number of nonvolatile memory cells which do not reach the predetermined level, and continuing erase verify processing for subsequent nonvolatile memory cells until a count value exceeds a set value set based on the number of redundant memory cells, wherein the step of sequentially preforming erase verify processing for the nonvolatile memory cells is performed free of any memory erase operation as long as the count value remains less than the set value.

\* \* \* \* \*